(12) United States Patent
Cole et al.

(10) Patent No.: US 7,867,915 B2
(45) Date of Patent: Jan. 11, 2011

(54) METHOD FOR ACTIVATING NITRIDE SURFACES FOR AMINE-REACTIVE CHEMISTRY

(75) Inventors: Christina L Cole, Alexandria, VA (US); Lloyd J Whitman, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 11/424,643

(22) Filed: Jun. 16, 2006

(65) Prior Publication Data

US 2006/0286803 A1  Dec. 21, 2006

Related U.S. Application Data

(60) Provisional application No. 60/691,767, filed on Jun. 16, 2005.

(51) Int. Cl.
*H01L 21/469* (2006.01)
(52) U.S. Cl. ................ 438/765; 438/685; 257/E21.326
(58) Field of Classification Search ................ 438/681, 438/793, 794, 685, 765
See application file for complete search history.

(56) References Cited

U.S. PATENT DOCUMENTS 4,465,552 A * 8/1984 Bobbio et al. ............... 438/722
6,475,277 B1 * 11/2002 Hirota et al. ................ 117/106
7,485,799 B2 * 2/2009 Guerra ....................... 136/245
2006/0264525 A1 * 11/2006 Ohwaki et al. ............... 522/18

OTHER PUBLICATIONS

Holloway et al., Journal of the Electrochemical Society 723, 123 (1976).
Matsuo et al., Sensors and Actuators 77, 1 (1981).
Harame, et al., IEEE Transactions on Electron Devices 1700, 34 (1987).
Gao, et al. Sensors and Actuators B 38-39, 38 (1997).
Manning et al., Langmuir 395, 21 (2005).
Karymov, et al., Sensors and Actuators B 324, 29 (1995).
Karymov, et al., Langmuir 4748, 12 (1996).

* cited by examiner

*Primary Examiner*—Alexander G Ghyka
(74) *Attorney, Agent, or Firm*—Amy Ressing; Roy Roberts

(57) ABSTRACT

Provided is a method for controllably activating a surface for stable amine-reactive chemistries. A surface containing nitride is exposed to a plasma having a reactive species containing hydrogen for a period of time sufficient to activate the substrate for amine-reactive chemistries. Amine-reactive chemical processes can then be applied to the activated surface to reliably and controllably bond molecules directly to said surface. The method is designed to create stable primary amines on the nitride substrate, so that any subsequent amine-reactive chemistry may proceed in a controlled manner that is directly proportional to the density of surface amines so created.

20 Claims, 3 Drawing Sheets

METHOD FOR ACTIVATING NITRIDE SURFACES FOR AMINE-REACTIVE CHEMISTRY

CROSS-REFERENCE TO RELATED APPLICATIONS

This Application is a Non-Prov of Prov (35 USC 119(e)) application 60/691,767 filed on Jun. 16, 2005 incorporated herein in full by reference.

BACKGROUND OF THE INVENTION

Nitride materials have applications in many fields of use because of their wide range of desirable physical, optical, and electronic properties. Many applications make use of the relative chemical inertness of these materials, which are typically stable at high temperatures and resistant to corrosion in acids. See, for example, Maboudiani and Carraro, Annual Review of Physical Chemistry 35-54, 55 (2004), and Strite and Morkoc, Journal of Vacuum Science and Technology B 1247-1266, 10 (1992). However, there are numerous applications where it is desirable to bond molecules to a nitride surface in order to provide the surface with specific chemical, physical, mechanical, and/or optical properties or functions (hereafter referred to as a functionalized surface). For applications where the functionalized surfaces are subsequently exposed to chemically reactive environments, including but not limited to ambient air, solvents, aqueous solutions, and biological matrices in vivo, covalent bonding directly to the surface would be particularly desirable. Some applications where functionalization via covalent bonding directly to a nitride surface would be desirable include but are not limited to chemical and biological sensors, microelectromechanical systems (MEMS) and nanoelectromechanical systems (NEMS), and biocompatible materials and devices. See, for example. D. Baselt. et al. Biosensors and Bioelectronics 731-739. 13 (1998); Craighead, Science 1532-1535, 290 (2000); Dion, Biomaterials 169-176, 14 (1993); Xu and Shi, Biomedical Scientific Instrumentation 585-589, 33 (1997).

Nitride materials exposed to air or water will naturally oxidize. Therefore, there is much prior art describing covalent coupling reactions to surface oxides, particularly for silicon nitride. See Holloway et al., Journal of the Electrochemical Society 723, 123 (1976) and Matsuo et al., Sensors and Actuators 77, 1 (1981). On a clean, stoichiometric silicon nitride surface, $Si_3N_4$, each nitrogen atom is bonded to three silicon atoms. Thus a complete surface hydrolysis reaction would be:

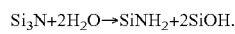

$$Si_3N+2H_2O \rightarrow SiNH_2+2SiOH.$$

$Si_3N_4$ surfaces hydrate completely into primary amines and silanols. See Harame, et al., IEEE Transactions on Electron Devices 1700, 34 (1987). Other nitrides, Linder the appropriate conditions, should also undergo surface hydrolysis to yield an amine+alcohol-terminated surface. Functionalization of silicon nitride surfaces has been performed almost exclusively using silane chemistry for covalent attachment through the silanol groups, most notably in biosensing applications. See Gao. et al . . . Sensors and Actuators B 38-39, 38 (1997) and Manning et al., Langmuir 395, 21 (2005). In general, the silane chemistries are extremely sensitive to pH, temperature, and relative humidity. The sensitivity of silane chemistries to these conditions make these methods difficult to perform consistently, causing the densities of the functional molecules to be unreliable and variable across each surface, and potentially leaving variable areas of the surface uncoated. These shortcomings are undesirable in many applications.

Although there are many coupling chemistries suitable for covalent bonding to an oxidized nitride surface, via a silanol for example, direct coupling to a surface amine might have advantages. Secondary functionalization through surface amines, as opposed to surface silanols, is much less sensitive to reaction conditions and environmental factors. Many molecules commonly used to functionalize surfaces intrinsically possess amine-reactive functionalities, especially in biomolecular applications. For example, aldehyde-amine reactions proceed to an appreciable extent over a range of pH values, including the physiological 6.8-7.8 range that many biomolecules, especially proteins, require to preserve their activity. The aldehyde-amine reaction is also much less dependent on environmental factors, including temperature and relative humidity, which can be difficult to control in basic laboratory or production settings. Similarly wide ranges of reaction conditions exist for other amine-reactive chemical groups, including, but not limited to, carboxylic acids, alcohols, sulfhydryls, and epoxides. A person skilled in the art of chemistry, biochemistry, or a related field would recognize there are many such methods.

Functionalization of silicon nitride surfaces could proceed via covalent chemistry that indiscriminately reacts with surface silanols and primary amines present at an unknown and uncontrolled surface density as a result of unintended chemical reactions that may occur during cleaning, processing, or storage. See Karymov. et al., Sensors and Actuators B 324, 29 (1995) and Karymov, et al. Langmuir 4748, 12 (1996). It is important to note that though the bonding may be reported as direct to the nitride surface, coupling via such native surface amines has only been presumed based on the assumption of stoichiometric surface hydrolysis in air or water, and the functional molecules of interest have been coupled to the surface through an intermediate chemical linker for increased stability.

Therefore, there is a need in the art for a method to controllably and reliably active nitride surfaces for stable amine-reactive chemistry so that the surfaces can be functionalized.

BRIEF SUMMARY OF THE INVENTION

One embodiment of the present invention provides a method for controllably activating a surface for stable amine-reactive chemistries. A surface containing nitride is exposed to a plasma having a reactive species containing hydrogen for a period of time sufficient to activate the substrate for amine-reactive chemistries. Amine-reactive chemical processes can then be applied to the activated surface to reliably and controllably bond molecules directly to said surface. The method can be used on nitride materials, including but not limited to, silicon nitride and gallium nitride. The method is designed to create stable primary amines on the nitride substrate, so that any subsequent amine-reactive chemistry may proceed in a controlled manner that is directly proportional to the density of surface amines so created. Other advantages and features of the invention will become apparent from the following detailed description of the preferred embodiments and the accompanying drawings.

DETAILED DESCRIPTION OF THE INVENTION

Figure 1:
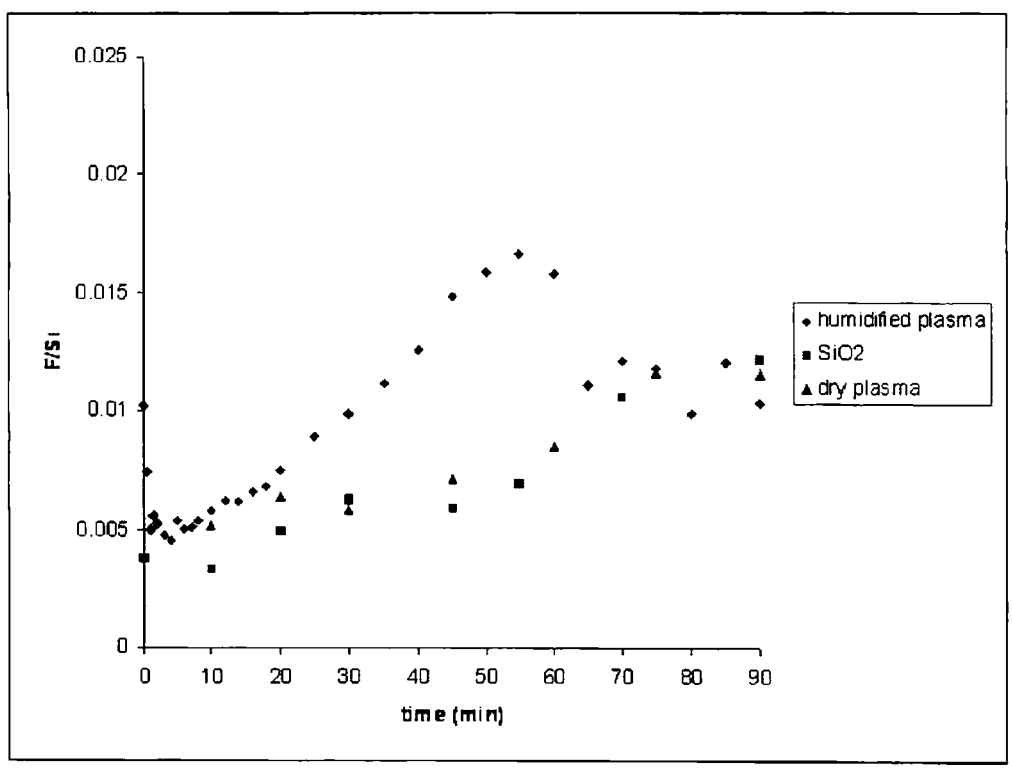
FIG. 1 is a chart showing data for TFMB labeling as a function of plasma me for three surfaces.

Before explaining at least one embodiment of the invention in detail, it is to be understood that the invention is not limited in its application to the details of construction and the arrangements of the components set forth in the following description or illustrated in the drawings. The invention is capable of other embodiments or of being practiced or carried out in various ways. Also, it is to be understood that the phraseology and terminology employed herein is for purpose of description and should not be regarded as limiting.

The present method for controllably activating a surface for stable amine-reactive chemistries uses a plasma generated by a feed gas that creates reactive species containing hydrogen. A plasma is generally defined to be a partially ionized gas composed of ions, electrons, and a variety of neutral species. Plasmas are generated by supplying energy to a neutral gas causing the formation of charge carriers, see Conrads and Schmidt, Plasma Sources Science and Technology 441-454, 9 (2000), incorporated herein in full by reference. Electrons and ions are produced in the gas phase when electrons or photons with sufficient energy collide with the neutral atoms and molecules in the feed gas (electron-impact ionization or photoionization). There are various ways to supply the necessary energy for plasma generation to a neutral gas. One possibility is to supply thermal energy, for example in flames, where exothermic chemical reactions of the molecules are used as the prime energy source. Adiabatic compression of the gas is also capable of gas heating Lip to the point of plasma generation. Yet another way to supply energy to a gas reservoir is via energetic beams that moderate in a gas volume. Beams of neutral particles have the added advantage of being unperturbed by electric and magnetic fields. Neutral beams are primarily used for sustaining plasmas or for plasma heating in fusion devices.

A widely used method for plasma generation utilizes the electrical breakdown of a neutral gas in the presence of an external electric field. Charge carriers accelerated in the electric field couple their energy into the plasma via collisions with other particles. Electrons retain most of their energy in elastic collisions with atoms and molecules because of their small mass and transfer their energy primarily in inelastic collisions. Discharges are classified as dc discharges, ac discharges, or pulsed discharges on the basis of the temporal behavior of the sustaining electric field. The spatial and temporal characteristics of a plasma depend to a large degree on the particular application for which the plasma will be used.

Glow discharge plasmas are frequently used for cleaning, preparation, and modification of surfaces. Glow discharges can be created by radio frequency (RF) or microwave high-frequency electromagnetic fields. A glow discharge is a plasma that exists in the pressure range of 1 Pa (7.5 mTorr) to 750 Pa (5.6 Torr) containing approximately equal concentrations of positive particles (positive ions) and negative particles (electrons and negative ions). The average energies of electrons in glow discharges is between 1-10 eV. In a typical commercial plasma cleaner, a sample is placed in the vacuum-tight plasma chamber. Process or feed gas(es) are admitted to the chamber at low flow rates (approximately 1-2 standard cubic feet per hour) using a valve and are kept at low pressure (approximately 200-600 mTorr) through vacuum pumping. The gases are subject to the induced RF electromagnetic fields to create a glow discharge.

Chemical reactions can occur both within a plasma and between a plasma and a surface. If the feed gas includes a source of hydrogen atoms, and the surface is a nitride, species in the plasma can react with the surface to create surface amines. For example, in one implementation, water can be added to ambient air for this purpose. When the plasma is created from the humidified air, reactive species are formed which could include free hydrogen ions, hydroxyl radicals (OH), various other oxide species, and ammonia or other amino species. Such reactive species can reduce the nitride to primary amines and thereby activate the surface for amine-reactive chemistry and subsequent functionalization. One skilled in the art would understand that there are many plasma sources and feed gases that could potentially be used to activate a nitride surface in this way.

The present method has a number of advantages over existing methods to activate or otherwise prepare silicon nitride and other nitride surfaces for subsequent functionalization. First, the creation of stable primary amines permits the controlled application of amine-reactive chemistries. Second, any primary amines created by this method are equally suited for subsequent aqueous and nonaqueous chemistries. The use of a single activation method for aqueous or solvent-based chemistry, and for processing steps that could proceed through a wide variety of functionalities, represents a significant advantage to the chemical modification of nitride substrates. Finally, it can be demonstrated that the bonding of amine-reactive molecules to a surface activated by this method is more stable than bonding to a native or incidentally hydrolyzed nitride surface. Subsequent chemical coupling reactions are thus expected to be more highly reproducible than, for instance, reactions that proceed via native amines or surface silanols.

The present invention provides in one embodiment for a method for controllably activating a surface for stable amine-reactive chemistries. A surface containing nitrogen is exposed to a plasma having a reactive species containing hydrogen for a period of time sufficient to activate the surface. The material can include, but is not limited to, silicon nitride, gallium nitride, aluminum nitride, carbon nitride, boron nitride, indium nitride, group III or group IV nitrides, transition metals, other metal nitrides, or alloys of said nitrides. The feed gas used for generating the plasma can be any feed gas that is capable of generating a reactive species containing hydrogen. Feed gases useful for this include but are not limited to inert gas and water or ambient air and water. Where the feed gas contains water, the relative humidity level of the feed gas ranges from about 1 percent to about 100 percent. Preferably, the humidity level ranges from about 70 percent to about 100 percent. The period of time will depend on the characteristics of the plasma and the feed gas used and the desired degree of activation. The period of time preferably ranges from about 10 minutes to about 60 minutes.

Another embodiment provides for method of creating stable amines on a surface. A surface containing nitrogen is exposed to a plasma having a reactive species containing hydrogen for a period of time sufficient to create stable amines on the surface. The material can include, but is not limited to, silicon nitride, gallium nitride, aluminum nitride, carbon nitride, boron nitride, indium nitride, group III or group IV nitrides, transition metals, other metal nitrides, or alloys of said nitrides. The feed gas used for generating the plasma can be any feed gas that is capable of generating a reactive species containing hydrogen. Feed gases useful for this include but are not limited to, inert gas and water or ambient air and water. Where the feed gas contains water, the relative humidity level of the feed gas ranges from about 1 percent to about 100 percent. Preferably, the humidity level ranges from about 70 percent to about 100 percent. The period of time will depend on the characteristics of the plasma and the feed gas used and the desired degree of activation. The period of time preferably ranges from about 10 minutes to about 60 minutes.

These and other features and advantages of the present invention will be presented in more detail in the following specification of the invention and the accompanying figures, which illustrate, by way of multiple examples, the principles of the invention.

EXAMPLE 1

Silicon wafers were sputter-coated with a 0.5 nm thickness of silicon nitride. Samples of the wafers were cleaned in 1% hydrofluoric acid for 5 seconds, then rinsed with deionized water and dried with nitrogen. Samples were then placed in the chamber of a Mercator Control Systems Model LF-5 Plasma System. This commercial plasma cleaner uses a 35 kHz RF generator to create a glow discharge. The plasma cleaner was operated with a power setting of 135 W at a pressure of 250 mTorr with a feed gas composed of ambient air with a controlled relative humidity of 70%. The samples were treated in the plasma cleaner for times ranging from 0 to 90 minutes. Samples prepared in this way will be referred to as Surface A.

Control nitride surfaces were prepared identically, except that the feed gas was composed of desiccated ambient air with a controlled relative humidity of <1%. Samples prepared in this way will be referred to as Surface B.

Control silicon oxide surfaces were prepared using silicon wafers with 50 nm of thermal oxide on the surface. Samples were cleaned in 1% hydrofluoric acid for 5 seconds, then rinsed with deionized water and dried with nitrogen. The samples were then treated in the plasma cleaner as above with a feed gas composed of ambient air with a controlled relative humidity of 70%. The samples were treated in the plasma cleaner for times ranging from 0 to 90 minutes. Samples prepared in this way will be referred to as Surface C.

All three surfaces were labeled with fluorine by immersion in a solution of 11% trifluoromiiethylbeiizaldehyde (TFMB) in hexane for 2 hours. TFMB preferentially foms a covalent bond with a primary amine, so that the resulting fluorine surface density should be proportional to the surface amine density. After labeling, samples were sonicated in hexane for 5 minutes, rinsed sequentially with acetone and ethanol, and dried with nitrogen.

X-ray photoelectron spectroscopy (XPS) measurements were taken using a commercial XPS system (Thermo VG Scientific Escalab 220i-XL) with a monochromatic Al K$\alpha$ source. Higs-resolution spectra were recorded for Si 2p, O 1 s, N 1 s, and F 1 s core levels and the peaks were fitted using Unifit XPS analysis software. The relative surface compositions were quantified by taking the ratio of the integrated peak intensity of each respective element to the silicon integrated peak intensity.

The graph show n in FIG. 1 presents data for TFMB labeling as a function of plasma exposure time for three surfaces: silicon nitride exposed to a humid ambient air plasma (hereafter referred to as Surface A), silicon nitride exposed to a dry ambient air plasma (hereafter referred to as Surface B), and silicon oxide exposed to a humid ambient air plasma (hereafter referred to as Surface C). It can clearly be seen that the amount of fluorine present on Surface A begins to increase well beyond the levels seen for the other surfaces after approximately 20 minutes of exposure. The number of binding sites peaks at approximately 55 minutes of exposure, and begins to decline after 60 minutes, falling back to the level of the other surfaces. TFMB binding, while favoring the amine reaction, may also occur via a slower competing reaction with hydroxyl groups, accounting for the presence of small amounts of fluorine on Surfaces B and C. The fact that the enhanced TFMB uptake seen for Surface A does not appear for Surface B, where no hydrogen source is present during plasma treatment, or for Surface C, where no nitride is present on the surface, gives a strong indication that primary amines groups are created directly on the nitride surface when treated with a humid air plasma as described.

Figure 2:
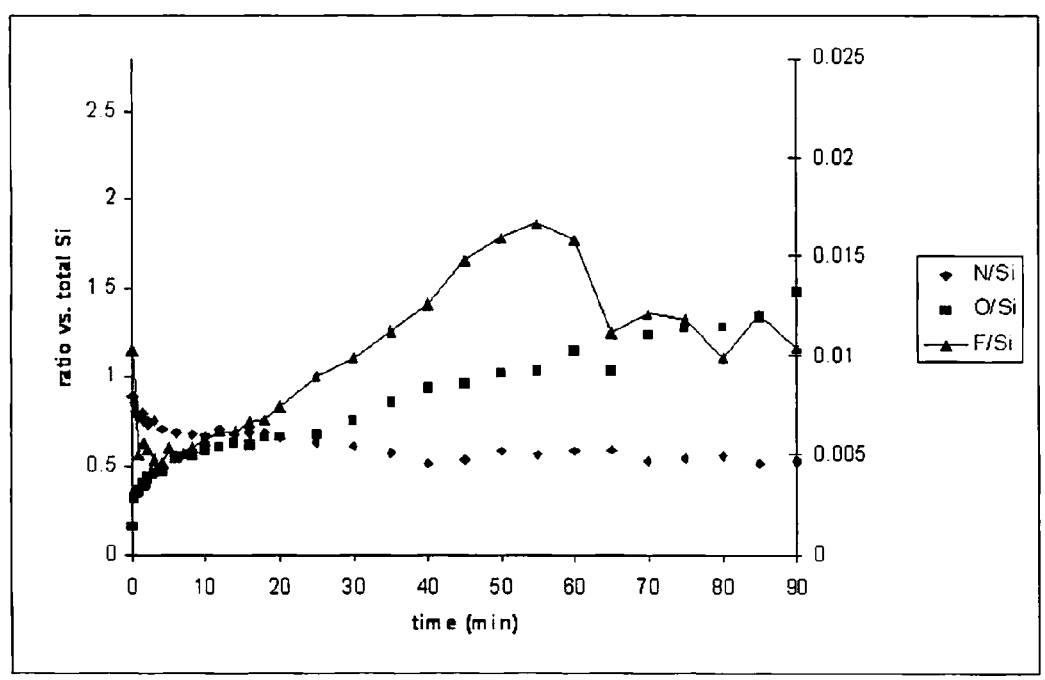
FIG. 2 is a graph showing the levels of oxygen and nitrogen as a function of humid ambient air plasma exposure time.

FIG. 2 depicts a graph tracking the levels of oxygen and nitrogen on Surface A as a function of humid ambient air plasma exposure time. Three distinct regimes are present during this process. The first phase takes place during the first 20-30 minutes of exposure, during which nitrogen is rapidly lost and oxygen is rapidly added to the surface. During this time, TFMB binding is low and closely resembles that seen for Surfaces B and C. In the second phase between 30 and 60 minutes of exposure, nitrogen loss from the surface slows and eventually stops. This regime corresponds to peak TFMB binding capacity. Finally, during the third phase, after 60-90 minutes of exposure, continued oxidation appears to bury the nitride entirely, preventing TFMB binding. The level of TFMB seen in this third phase closely resembles that seen for Surfaces B and C after similar exposure times. In this phase, the nitride surface appears to be fully oxidized, with a chemical reactivity characteristic of a silicon oxide surface.

The initially high level of TFMB binding observed for Surface A without exposure to the humid plasma (i.e . . . at t=0), and the rapid decline in that binding following brief exposures (t<10 minutes), can be explained by the observed behavior of surfaces subsequently immersed in water for 30 minutes. The water completely removed the TFMB from surfaces that had been exposed to the humid plasma for less than 10 minutes, but had no affect on the activated surfaces (t>10 minutes). On the non-activated surfaces, the TFMB most likely binds to surface silanols and/or primary amines present at an unknown and uncontrolled surface density as a result of unintended chemical reactions during the initial sample preparation, but these chemical groups are quickly oxidized in aqueous solutions, leaving no amines stable enough for subsequent binding.

Additional advantages of the present invention are illustrated by a comparison with nitride surfaces activated for amine-reactive chemistry using a silane. First, surfaces were prepared by the method of the present invention. Silicon wafers were sputter-coated with a 0.5 nm thickness of silicon nitride. Samples were cleaned in 1% hydrofluoric acid for 5 seconds, then rinsed with deionized water and dried with nitrogen. Samples were then placed in the plasma chamber. The plasma cleaner was operated with a power setting of 135 W at a pressure of 250 mTorr with a feed gas composed of ambient air with a controlled relative humidity of 70%. The samples were treated in the plasma cleaner for 10 minutes. Samples prepared in this way will be referred to as Surface D.

A second set of samples was prepared from the same silicon nitride-coated wafers, but with a silane-based activation method. These silicon nitride-coated wafers were cleaned for 5 seconds in hydrofluoric acid, then immersed in 3:1 $H_2SO_4$: $H_2O_2$ for 30 minutes. The were then rinsed in deionized water and dried with nitrogen. Samples were transferred into a nitrogen glove-box, where they were immersed in a 2% solution of aminopropyltrimetlhoxysilane (APTMS) in absolute ethanol for approximately 24 hours. The samples were then removed, rinsed with ethanol, and dried with nitrogen. Samples prepared in this way will be referred to as Surface E.

Both Surface D and Surface E were labeled with fluorine by immersion in a TFMB as described above. XPS spectra of the fluorine were measured on Five sample surfaces in each set. Two XPS readings were taken from different spots on each surface for a total of 10 spectra per surface treatment. Multiple spectra were recorded in this way to observe reproducibility not only from one sample to another, but from one area to another on individual surfaces. As shown in Table 1, a single standard deviation for Surface D (those activated by the humid air plasma) amounts to only 9% of the total fluorine intensity, whereas a single standard deviation for Surface E (activated by addition of an amine-terminated silane) equals 69% of the total signal intensity. It should also be noted that in order to obtain five silane-coated samples suitable for labeling 21 attempts were made (a 24% success rate). The 16 failed attempts were divided almost equally between surfaces that showed no appreciable silane coverage via XPS, and those that showed thick over-polymerization of the silane (as indicated by a total attenuation of the substrate signals). Note that because only these suitable silane surfaces were labeled with TFMB, the overall reproducibility for these samples is actually much worse than the results reported in Table 1.

TABLE 1

| | Average F/Si | Standard Deviation | % Deviation |
|---|---|---|---|
| Plasma (surface D) | $1.4 \times 10^{-2}$ | $0.1 \times 10^{-2}$ | 9% |
| Silane (surface E) | $15.5 \times 10^{-2}$ | $10.7 \times 10^{-2}$ | 69% |

The utility of the present invention for functionalizing a nitride surface with biomolecules is demonstrated in Example 2. Silicon wafers coated with a film of silicon nitride approximately 150 nm thick were cleaned with 3:1 $H_2SO_4$: $H_2O_2$ for 10 minutes under ambient conditions. The samples were then rinsed in deionized water and dried with nitrogen. The samples were then treated in the plasma chamber for 10 minutes. The plasma cleaner was operated with a power setting of 135 W at a pressure of 250 mTorr with a feed gas composed of ambient air with a controlled relative humidity of 83%.

Figure 3:
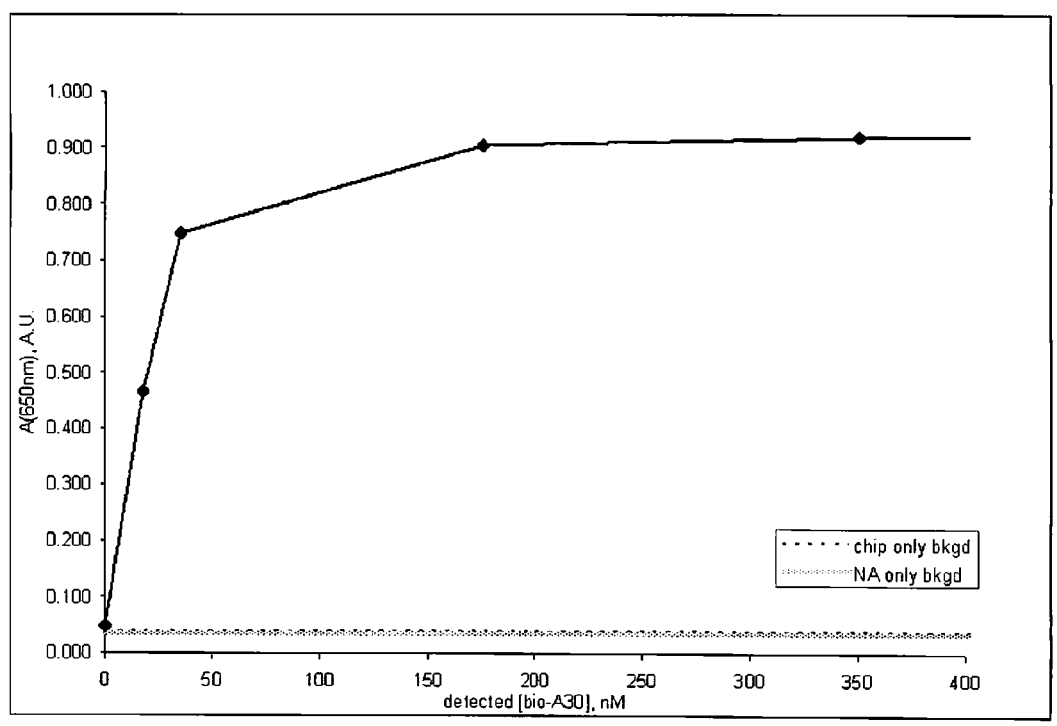
FIG. 3 is a graph showing the dose response of biotinylated-(dA)$_{30}$ on Si$_4$N$_3$/NeutrAvidin®.

The surfaces activated by the humid plasma were reacted with freshly-prepared 20% glutaraldehyde (aq) for 2 hours under ambient conditions. Unreacted glutaraldehyde was removed by aspiration from the surface at the end of the incubation. Each glutaraldehyde-coated chip was then reacted with 2 mg/mL aqueous NeutrAvidin®, which is a commercial avidin analogue, for 30 minutes at ambient temperature, followed by incubation with various concentrations of a synthetic biotinylated-$(dA)_{30}$ oligonucleotide (oligos). The purpose of the bifunctional glutaraldehyde is to present a consistent density of amine-reactive sites for a range of surface amine densities on the activated nitride surface, and to enhance the steric availability of the NeutrAvidin to the biotinylated oligos. The immobilized oligos were then hybridized to a $(dT)_{18}$-digoxigenin (DIG) sample, and then labeled with anti-DIG-HRP. Finally, chips were incubated with an HRP-specific substrate for 10 minutes, and any product quantitated by UV-vis absorbance. FIG. 3 shows the dose response of biotinylated-$(dA)_{30}$ on $Si_4N_3$/NeutrAvidin. Lines at approximately 0.050 A.U. represent enzyme substrate signal due to $Si_4N_3$ and $Si_4N_3$/NeutrAvidin only, respectively.

The functionality of the oligonucleotide layer in this Example 2 as coupled to the avidin via an amine-reactive homobifunctional crosslinker (glutaraldehyde) demonstrates the robustness and stability of the present method for activating silicon nitride surfaces for amine-reactive chemistry.

In addition to silicon nitride, other nitride substrates can also be readily functionalized by this process. Using the similar procedures, a gallium nitride surface was activated and functionalized with biomolecules in Example 3. Three GaN samples were cleaned in an ultraviolet/ozone (UV/ozone)-generating chamber for 30 minutes, then rinsed in 18.5% hydrochloric acid and dried with nitrogen. The samples were then activated by plasma treatment for 12 minutes using ambient air with a controlled relative humidity of 80%. The surfaces were reacted with 100 µL (each) of 20% glutaraldehyde for 2 hours. The surfaces were then aspirated to remove excess glutaraldehyde. One of the three GaN samples was then set aside (PG control).

The two other GaN samples were placed in 100 µL (each) of 2 mg/mL NeutrAvidin (NA) solution for 35 minutes. The samples were then rinsed with deionized water and dried with nitrogen.

100 µL of 1 µM biotinylated, fluorescein-labeled, single-stranded DNA in 75 mM sodium citrate/750 mM sodium chloride was added to one of the NA-coated GaN surfaces and to the "PG control" surface (with no NA). Nonbiotinylated, fluorescein-labeled, single-stranded DNA in 75 mM sodium citrate/750 mM sodium chloride was added to the other NA-coated surface. The DNA on all three of these surfaces was allowed to react for 30 minutes. All chips were then rinsed in 10 mM Tris/100 mM sodium chloride/0.05% Txween 20/0.1% bovine serum albumin followed by deionized water, and dried with nitrogen.

Surface fluorescence was observed on a microscope using Zeiss filter set #10. This filter set has an excitation band pass of 450 nm-490 nm and an emission band pass of 515 nm-565 nm, appropriate to observe the fluorescein isothiocyanate label on the DNA. The only sample that fluoresced was the fully functionalized surface that included the biotinylated, fluorescein-labeled, single-stranded DNA specifically immobilized on the NA film covalently bound via the glutaraldehyde to the activated GaN surface. As an additional control, DNA was also spotted onto a NA-coated surface. For this control, fluorescence was only observed in the region in which the DNA was spotted on the surface.

Several different sources of silicon nitride and different gallium nitride wafers of varying nitride surface layer thicknesses were used in this method, indicating that the controlled activation of the surface for stable amine-reactive chemistry is not specific to one type of nitride.

In addition to silicon nitride and gallium nitride, the method should be applicable to a wide range of materials where one element is nitrogen, including but not limited to, aluminum nitride, carbon nitride, boron nitride, indium nitride, other group III or group IV nitrides; transition metal and other metal nitrides; and alloys of said nitrides.

The use of a glow discharge RF plasma is not a specific requirement; any plasma that can create reactive species containing hydrogen should be effective.

Ambient air with different humidity levels were used in this method, demonstrating that a specific humidity is not a requirement. The activation of the surface can be achieved with a relative humidity between 1% and 100%. The specific humidity required to achieve the desired degree of activation could be determined without undue experimentation using the methods described herein, or others known to a person skilled in the art.

A plasma feed gas composed of humid ambient air to activate the nitride surface is not a specific requirement: any feed gas that can create reactive species containing hydrogen should be effective.

Activation by a plasma for times between 10 min and 60 min were used in this method demonstrating that a specific time is not a requirement; activation of the surface can be achieved with arbitrary times as determined by the characteristics of the plasma and feed gas used. The specific treatment time required to achieve the desired degree of activation could be determined without undue experimentation using the methods described herein, or others known to a person skilled in the art.

In addition to the preparation of TFMB-coated surfaces and surfaces functionalized with biomolecules demonstrated here, the method is useful for many other fields of use where the surface material is either intrinsically a nitride or can be coated with a nitride film, including but not limited to, improving the biocompatibility and/or non-fouling properties of electronic, magnetic, optical, or mechanical devices, components, and materials designed for in vivo use in humans and other organisms; in vitro use with living cells or other living biological matrices, and use in marine and other aqueous environments.

Obviously, many modifications and variations of the present invention are possible in light of the above teachings. It is therefore to be understood that, within the scope of the appended claims, the invention may be practiced otherwise than as specifically described.

What is claimed as new and desired to be protected by Letters Patent of the United States is:

1. A method for controllably activating a surface for stable amine-reactive chemistries comprising:
    providing a surface comprised of a material containing nitrogen, wherein said material is selected from the group consisting of group III and group IV nitrides;
    generating a plasma from a feed gas, said plasma comprising a free hydrogen-containing species reactive to nitrogen; and
    reacting said free hydrogen-containing species with said nitrogen in said surface material for a period of time sufficient to create stable amines on the surface.

2. The method of claim 1 wherein said feed gas is comprised of an inert gas and water.

3. The method of claim 2 wherein said feed gas has a relative humidity level ranging from 1 percent to 100 percent.

4. The method of claim 3 wherein said feed gas preferably has a relative humidity level ranging from about 70 percent to about 100 percent.

5. The method of claim 1 wherein said feed gas is comprised of air and water.

6. The method of claim 5 wherein said feed gas has a relative humidity level ranging from 1 percent to 100 percent.

7. The method of claim 6 wherein said feed gas preferably has a relative humidity level ranging from about 70 percent to about 100 percent.

8. The method of claim 1 wherein said plasma is a glow discharge plasma.

9. The method of claim 1 wherein said period of time preferably ranges from about 10 minutes to about 60 minutes.

10. A method of creating stable amines on a surface comprising:
    providing a surface comprised of a material containing nitrogen wherein said material is selected from the group consisting of group III and group IV nitrides;
    generating a plasma from a feed gas, said plasma comprising a free hydrogen-containing species reactive to nitrogen; and
    exposing said nitrogen in said surface to said free hydrogen-containing species for a period of time sufficient to create stable amines on said surface.

11. The method of claim 10 wherein said feed gas is comprised of an inert gas and water.

12. The method of claim 11 wherein said feed gas has a relative humidity level ranging from 1 percent to 100 percent.

13. The method of claim 12 wherein said feed gas preferably has a relative humidity level ranging from about 70 percent to about 100 percent.

14. The method of claim 10 wherein said feed gas is comprised of air and water.

15. The method of claim 14 wherein said feed gas has a relative humidity level ranging from 1 percent to 100 percent.

16. The method of claim 15 wherein said feed gas preferably has a relative humidity level ranging from about 70 percent to about 100 percent.

17. The method of claim 10 wherein said plasma is a glow discharge plasma.

18. The method of claim 10 wherein said period of time preferably ranges from about 10 minutes to about 60 minutes.

19. A method for controllably activating a silicon nitride surface for stable amine-reactive chemistries comprising:
    providing a surface comprising a layer of silicon nitride; and
    exposing said layer to a plasma, said plasma comprising a free hydrogen-containing species reactive to nitrogen for a period of time sufficient to create stable amines on said layer.

20. A method for controllably activating a gallium nitride surface for stable amine-reactive chemistries comprising:
    providing a surface comprising a layer of gallium nitride; and
    exposing said layer to a plasma, said plasma comprising a free hydrogen-containing species reactive to nitrogen for a period of time sufficient to create stable amines on said layer.

* * * * *